(12) United States Patent
Douriet et al.

(10) Patent No.: US 7,469,199 B2
(45) Date of Patent: Dec. 23, 2008

(54) APPARATUS AND METHOD FOR SELECTIVELY MONITORING MULTIPLE VOLTAGES IN AN IC OR OTHER ELECTRONIC CHIP

(75) Inventors: Daniel Douriet, Round Rock, TX (US); Anand Haridass, Austin, TX (US); Andreas Huber, Austin, TX (US); Colm B. O'Reilly, Austin, TX (US); Bao G. Truong, Austin, TX (US); Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 297 days.

(21) Appl. No.: 11/278,848

(22) Filed: Apr. 6, 2006

(65) Prior Publication Data
US 2007/0239387 A1    Oct. 11, 2007

(51) Int. Cl.
*G06F 11/00* (2006.01)
(52) U.S. Cl. ........................................ 702/188
(58) Field of Classification Search ............... 702/188; 327/541; 323/311
See application file for complete search history.

(56) References Cited

U.S. PATENT DOCUMENTS

| | | | |
|---|---|---|---|
| 2003/0184384 A1* | 10/2003 | Orr et al. | 330/286 |
| 2005/0046467 A1* | 3/2005 | Kase et al. | 327/541 |
| 2005/0226076 A1* | 10/2005 | Petersen | 365/226 |
| 2006/0013331 A1* | 1/2006 | Choi et al. | 375/288 |
| 2006/0197697 A1* | 9/2006 | Nagata | 342/22 |
| 2006/0214650 A1* | 9/2006 | Hirooka | 323/311 |

* cited by examiner

*Primary Examiner*—Bryan Bui
*Assistant Examiner*—Xiuquin Sun
(74) *Attorney, Agent, or Firm*—Duke W. Yee; Casimer K. Salys; Houda El-Jarrah

(57) ABSTRACT

An apparatus and method are provided for monitoring the voltage available in each domain of multiple voltage domains of a partitioned electronic chip. The apparatus comprises a single conductive link coupled to the chip, and further comprises a domain selection network having a single output and a plurality of switchable inputs, the output being connected to the single conductive link, and two inputs being connected to monitor respective voltage levels of two of the plurality of voltage domains. A control mechanism is disposed to operate the selection network, in order to selectively connect one of the inputs to the single conductive link, and a sensor device external to the electronic chip is connected to measure the monitored respective voltage levels of two of the plurality of voltage domains using the single conductive link.

3 Claims, 3 Drawing Sheets

APPARATUS AND METHOD FOR SELECTIVELY MONITORING MULTIPLE VOLTAGES IN AN IC OR OTHER ELECTRONIC CHIP

BACKGROUND OF THE INVENTION

1. Field of the Invention

The invention disclosed and claimed herein generally pertains to an apparatus for monitoring at least one voltage of each domain in an electronic chip partitioned into multiple voltage domains. More particularly, the invention pertains to apparatus of the above type wherein a single conductive link, such as a single pair of C4 pins, is used to measure the voltage levels of all the voltage domains of the chip. Even more particularly, the invention pertains to apparatus of the above type wherein voltages of respective domains may be applied to the single conductive link in a prescribed sequence.

2. Description of the Related Art

It has been conventional practice to measure or monitor voltage drop of an integrated circuit (IC), or other electronic semiconductor chip, by dedicating two conductive pins of the chip for this purpose. These pins, commonly referred to as C4 pins, are conductive elements provided to attach the chip to its associated package. One of the pins is coupled to ground, and the other pin is tapped into the chip power distribution. This pin is routed from the chip through the package, to enable voltage measurement at the card level during system operation.

In recent years, it has been recognized that there are benefits in using multi-core microprocessors for certain tasks or applications. In a multi-core processor, two or more independent processors are combined in a single chip or IC. In one useful application, multi-core processors are used to enable a computing device to exhibit a form of thread-level parallelism (TLP), without including microprocessors in separate packages. However, placing multiple processors on the same chip has caused power densities to increase. Moreover, it has become necessary to partition the chip into multiple voltage domains or voltage islands, wherein each domain has a voltage that must be set to a specified point or level. This must be done to maximize yield and/or performance.

Partitioning a chip into multiple domains has required that a number of C4 pin pairs must be dedicated on the chip, one pair for monitoring the voltage of each domain, to sense each domain. Respective voltages are monitored, so that each voltage domain can be adjusted to the correct voltage set point. A currently used arrangement of this type is shown in FIG. 1, and is described hereinafter. However, requiring one pair of pins for each voltage domain is expensive. Moreover, each pair of pins used for voltage monitoring or sensing is not available for sending power to a chip, or for signaling therewith. Accordingly, the chip must be provided with additional pairs of pins for these tasks, which can further increase both cost and complexity of the chip. It would thus be beneficial to provide some means for reducing the number of pin pairs that are required for voltage monitoring.

SUMMARY OF THE INVENTION

The invention generally provides an apparatus and method for monitoring the voltage available in each domain of multiple voltage domains or islands of a partitioned electronic chip, such as an integrated circuit or other semiconductor device. In the invention, only a single conductive link extending out from the chip, such as a single pair of C4 pins, is required for all of the monitoring activity. One useful embodiment of the invention is directed to apparatus for monitoring the level of a voltage associated with each domain in a partitioned chip of the above type. The apparatus comprises a single conductive link coupled to the chip, and further comprises a domain selection network having a single output and a plurality of switchable inputs, the output being connected to the single conductive link, and two inputs being connected to monitor respective voltage levels of two of the plurality of voltage domains. The apparatus is further provided with a termination network and a transmission link for connecting the termination network to the single conductive link. A control mechanism is disposed to operate the selection network, in order to selectively connect one of the inputs to the single conductive link. The conductive link usefully comprises a single pair of C4 or other conductive pins. A sensor device is connected to measure the monitored respective voltage levels of two of the plurality of voltage domains using the single conductive link.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
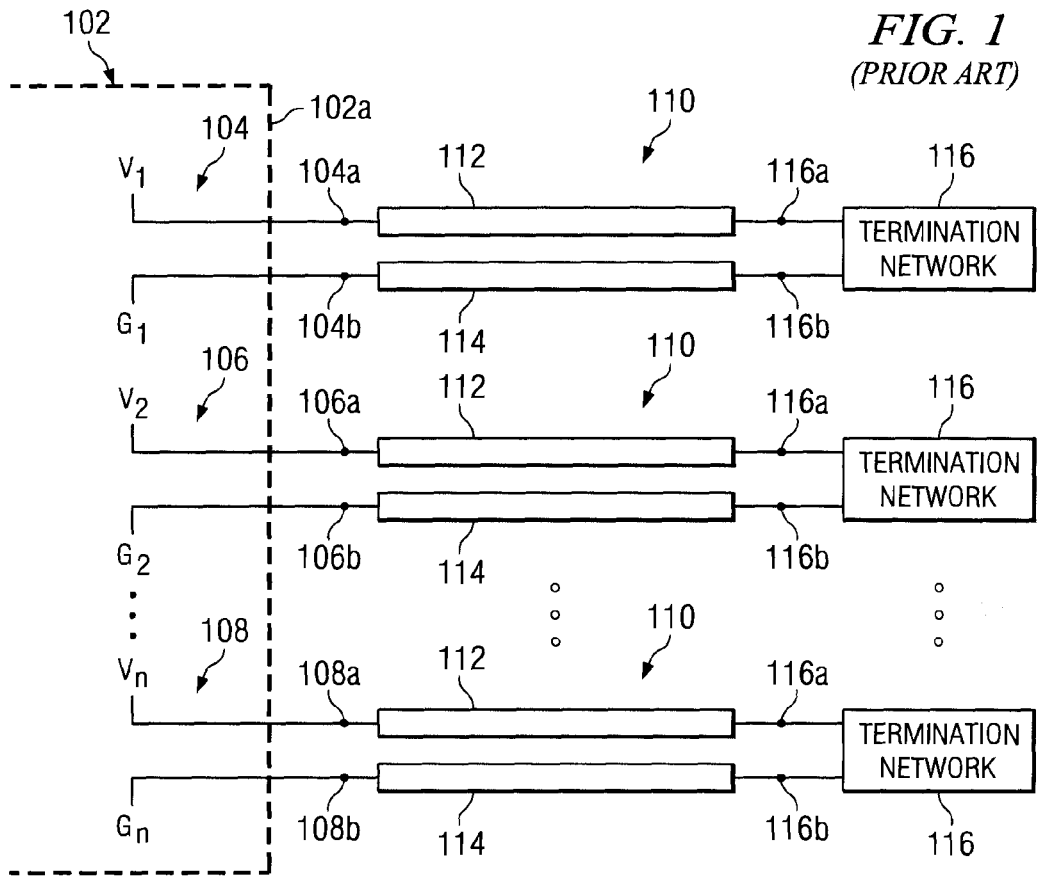
FIG. 1 is a schematic diagram showing an IC voltage monitoring arrangement of the prior art.

Referring to FIG. 1, there is shown an integrated circuit (IC) 102, or other semiconductor chip, that has been partitioned into n multiple voltage domains. Accordingly, it is necessary to monitor voltage levels $V_1$-$V_n$, or one voltage level for each domain. Alternatively, it may be necessary to monitor voltage levels $V_1$-$V_n$, wherein two or more of the voltage levels all belong to and are sensed at different locations of a single one of the domains. In order to use a common prior art technique to carry out this task, it is necessary to provide one pair of C4 pins, or like conductive elements, for every one of the n voltage levels to be measured. Thus, FIG. 1 shows an IC 102 provided with C4 pin pairs 104, 106 and 108, for domain voltages $V_1$, $V_2$ and $V_n$, respectively. Each pair of C4 pins extends outwardly from IC 102, across an IC-package boundary 102a. The boundary 102a is at the interface between IC 102 and a package (not shown) to which the IC is attached. Pin 104a of pin pair 104 is connected to the domain voltage $V_1$, and pin 104b is connected to an associated ground $G_1$. Similarly, pins 106a and 108a are respectively connected to voltages $V_2$ and $V_n$, and pins 106b and 108b are coupled to the respective corresponding grounds $G_2$ and $G_n$.

FIG. 1 further shows a differential transmission line or link 110 for each pin pair, each differential link 110 comprising conductors 112 and 114. Each C4 pin coupled to a domain voltage is connected to one of the differential conductors 112, and each C4 pin coupled to a ground is connected to a conductor 114. As described hereinafter in further detail in connection with FIG. 2, the conductors 112 and 114 of the differential transmission link operate collectively to provide a voltage in which any coupled voltage noise is suppressed.

Referring further to FIG. 1, there is shown a termination network 116 connected to each differential transmission link 110, through a set of terminals 116a and 116b. The terminal network 116, which may be of a type described hereinafter in connection with FIG. 4, couples a known load to each differential transmission link 110. When IC 102 is brought to its steady state voltage, each voltage level $V_1$-$V_n$, can be measured across the terminals 116a and 116b that are connected to the corresponding link 110. As described above, it would be very beneficial to eliminate the need for multiple pairs of C4 pins and related components, in order to monitor multiple voltage levels in a partitioned chip.

Figure 2:
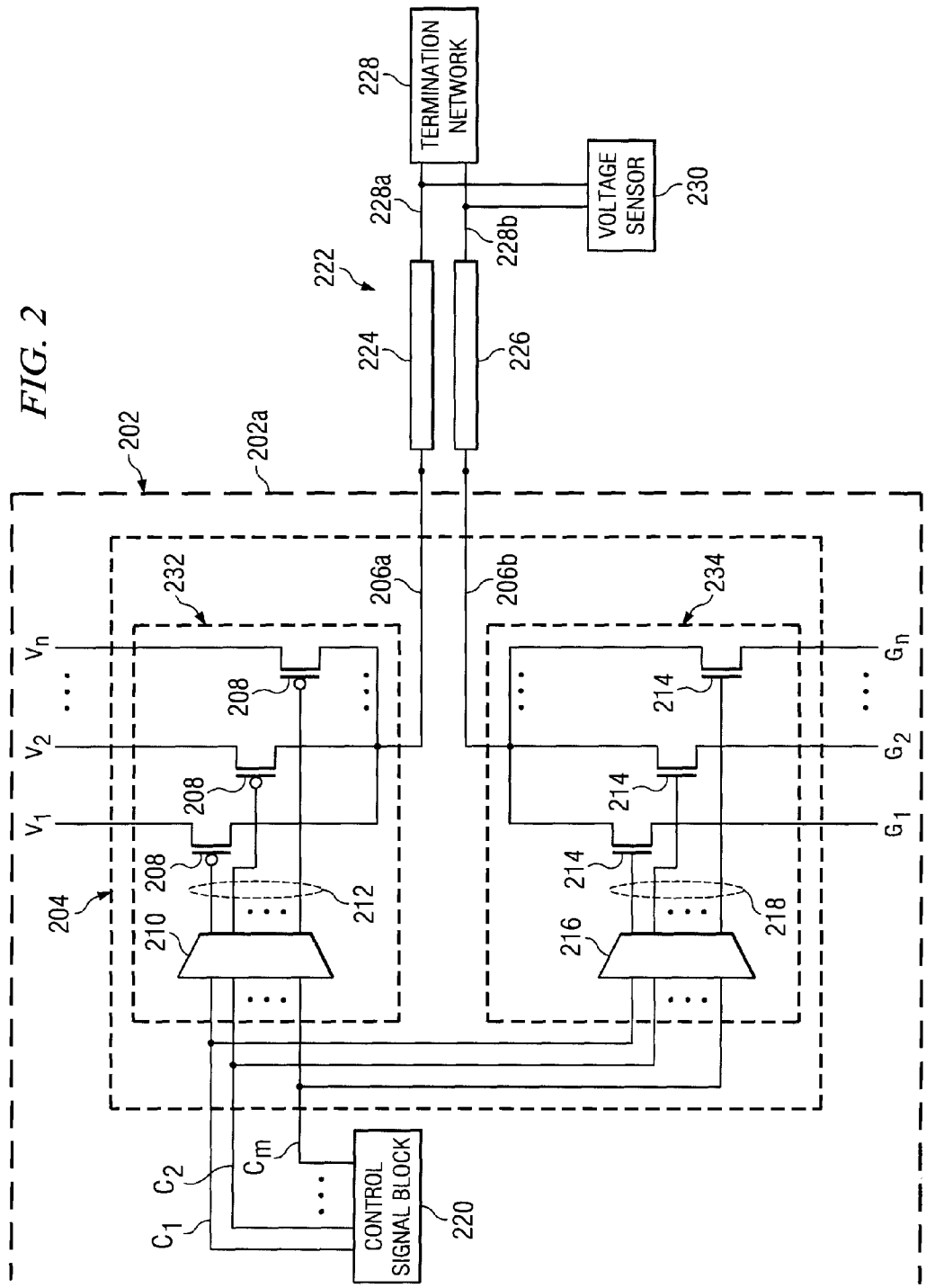
FIG. 2 is a schematic diagram showing an embodiment of the invention for monitoring voltage at multiple voltage domains in an IC.

Referring to FIG. 2, there is shown an integrated circuit 202 that has been partitioned into n multiple voltage domains, in like manner with IC 102 of FIG. 1. In order to monitor domain voltage levels $V_1$-$V_n$ in integrated circuit 202, an embodiment of the invention is provided that includes a modable voltage selection network 204, that is formed within IC 202. The embodiment of the invention requires only a single pair of connective elements 206, such as a pair of C4 pins, rather than the n pairs needed for the prior art arrangement of FIG. 1. Pin pair 206 extends outwardly from IC 202, across IC-package boundary 202a.

FIG. 2 shows voltage selection network 204 provided with a set of switching elements 208, such as transistor switches, wherein each switch 208 has an input connected to one of the domain voltages $V_1$-$V_n$. For example, a switch input may be provided by a trace or other conductive path (not shown) extending from the switch input to the location of a domain (not shown) at which a particular domain voltage is to be sensed or acquired. Respective outputs of the switches 208 are all connected to C4 pin 206a, one of the pins of pin pair 206. FIG. 2 further shows a select logic 210 included in selection network 204, which is operable to send switch enabling signals 212 to the gates or base terminals of respective switches 208. The signals 212 provided by select logic 210 thus determine whether each switch 208 is turned on or off, so that its corresponding voltage is respectively connected to or disconnected from C4 pin 206a. The switches 208, select logic 210 and signals 212 collectively comprise a multiplexer 232. Switches 208 may, for example, comprise p-channel field effect transistors (FETs), but are not limited thereto.

Referring further to FIG. 2, there are shown ground connections $G_1$-$G_n$, which are the ground connections for the voltage domains associated with voltage levels $V_1$-$V_n$, respectively. Each ground is connected as an input to one of a set of switching elements 214, which are similar or identical to switches 208. The output of switches 214 are all connected to C4 pin 206b, the other pin of the pin pair 206. Select logic 216, similar to select logic 210, is operable to send switch enabling signals 218 to the gates or base terminals of respective switches 214. The signals 218 provided by select logic 216 thus determine whether each switch 214 is turned on or off, so that its corresponding ground is respectively connected to or disconnected from C4 pin 206b. The switches 214, select logic 216 and signals 218 collectively comprise a multiplexer 234. Switches 214 may, for example, comprise n-channel FETs, but are not limited thereto.

FIG. 2 further shows a control signal block 220 that selectively applies control signals $C_1$-$C_m$ to each of the multiplexers 210 and 216. When a certain logical combination of signals $C_1$-$C_m$ is coupled to multiplexers 232 and 234, signals 212 and 218 are generated to close the switches 208 and 214 that respectively receive $V_1$ and $G_1$ as inputs, while the other switches all remain open. More generally, when another combination of control signals are applied to multiplexers 232 and 234, the switches connected to inputs $V_1$ and $G_1$ are closed, thereby connecting $V_1$ and $G_1$ to C4 pins 206a and 206b, respectively. All other switches remain open.

FIG. 2 shows a differential transmission line or link 222, comprising differential conductors 224 and 226, that are connected between C4 pin pair 206 and a terminal network 228. More specifically, conductor 224 is connected to pin 206a and conductor 226 is connected to pin 206b. Transmission line 222 is constructed so that any external current or voltage signal noise coupled onto conductor 224 will be coupled equally onto conductor 226 so that no net differential noise is added onto the sensed voltage. Accordingly, the detectable voltage at the output of transmission line 222 will be the differential between the voltages of conductors 224 and 226. This differential voltage will be the true or undistorted voltage level of the domain voltage $V_1$ that is connected to link 222 through one of the switches 208.

The output of link 222, at terminals 228a and 228b, is connected to a termination network 228, described hereinafter in connection with FIG. 4. Thus, the voltage level $V_1$-$G_1$, when applied to pin pair 206, can be measured across the terminals 228a and 228b. FIG. 2 shows a voltage sensor 230 connected to terminals 228a and 228b, for use in obtaining such voltage measurements. More generally, any of the voltages $V_n$ may be measured with respect to its corresponding ground by sensor 230. It is to be emphasized that the IC need not be at a steady state voltage, in order to make a voltage measurement. In fact, it may be preferable to measure the transitions and/or noise seen on a voltage $V_n$-$G_n$.

Figure 3:
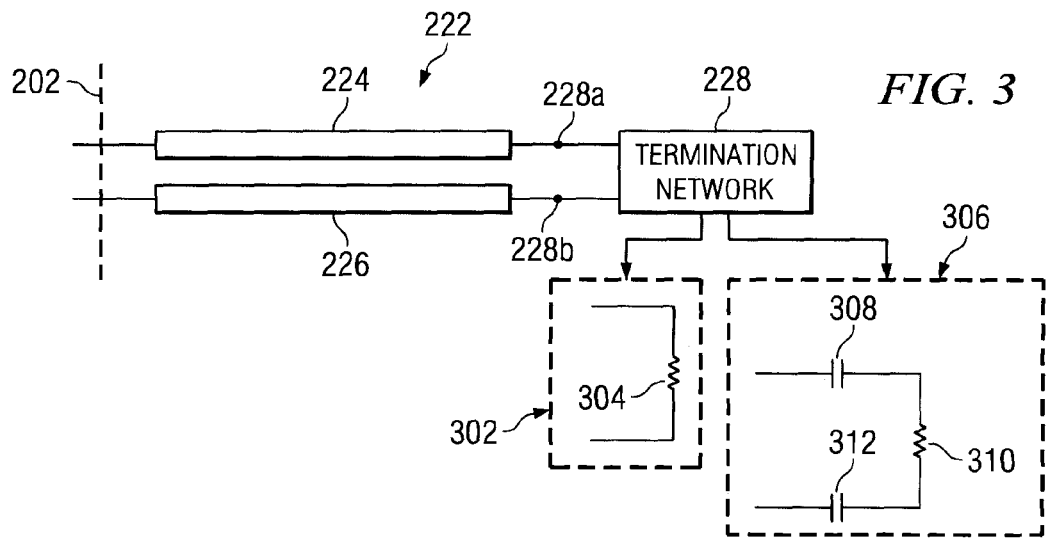
FIG. 3 is a schematic diagram showing a termination network for the embodiment of FIG. 2 in greater detail.

Referring to FIG. 3, there are shown two alternative potential variations of the termination network 228, comprising a configuration 302, when the resistance of the chip is low, and a configuration 306 when the chip resistance is high. Configuration 302 comprises only a resistor 304. Configuration 306 comprises a capacitor 308, a resistor 310 and a DC blocking capacitor 312. In a further alternative, termination network 228 could comprise a system or network (not shown) that was configured to compensate for parasitic effects caused by voltage selection network 204, pin pair 206, transmission line 222, or voltage sensor 230.

In a useful embodiment of the invention, a computer or data processing system could be connected to control signal block 220, to direct the operation thereof. The data processing system could also be connected to receive and process domain voltage measurements provided by sensor 230. Referring to FIG. 4, there is shown a block diagram of a generalized data processing system 400 which may be used in such embodiment. Data processing system 400 exemplifies a computer, in which code or instructions for implementing the processes of the present invention may be located. Data processing system 400 usefully employs a peripheral component interconnect (PCI) local bus architecture, although other bus architectures may alternatively be used. FIG. 4 shows a processor 402 and main memory 404 connected to a PCI local bus 406 through a Host/PCI bridge 408. PCI bridge 408 also may include an integrated memory controller and cache memory for processor 402.

Figure 4:
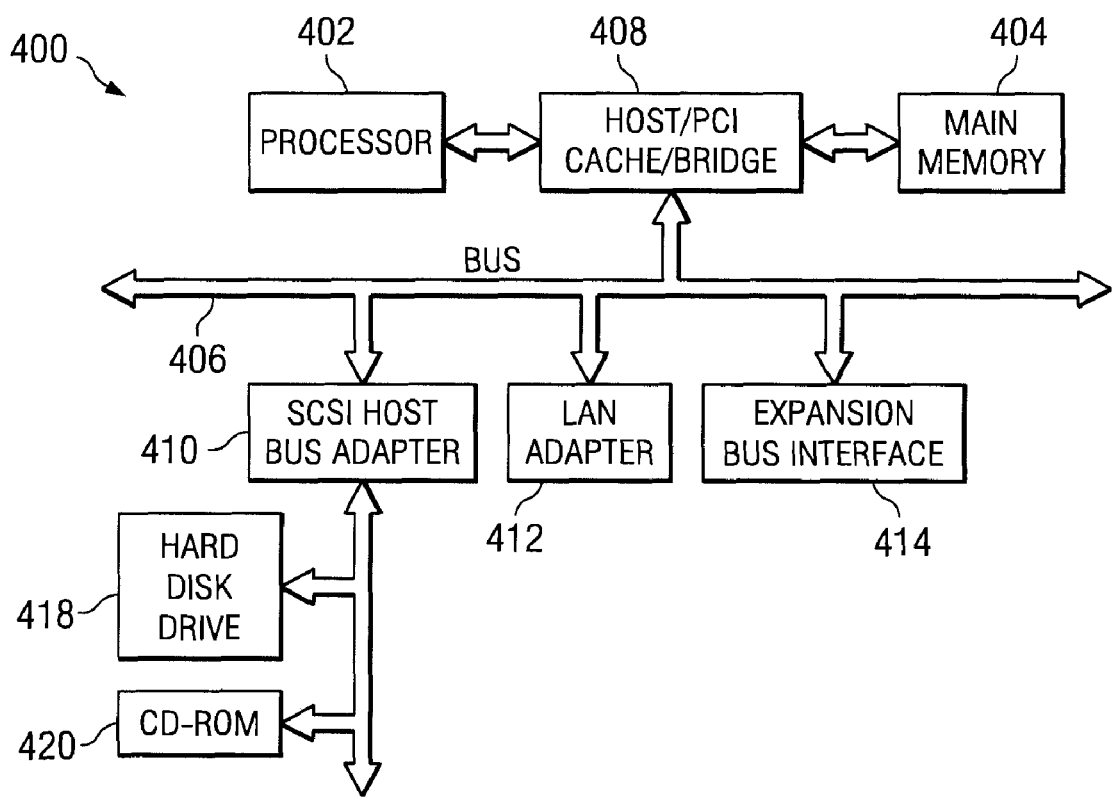
FIG. 4 is a block diagram depicting a data processing system for use in an embodiment of the invention.

Referring further to FIG. 4, there is shown a local area network (LAN) adapter 412, a small computer system interface (SCSI) host bus adapter 410, and an expansion bus interface 414 respectively connected to PCI local bus 406 by direct component connection. SCSI host bus adapter 410 provides a connection for hard disk drive 518, and also for CD-ROM drive 420.

An operating system runs on processor 402 and is used to coordinate and provide control of various components within data processing system 400 shown in FIG. 4. The operating system may be a commercially available operating system such as Windows XP, which is available from Microsoft Corporation. Instructions for the operating system and for applications or programs are located on storage devices, such as hard disk drive 420, and may be loaded into main memory 404 for execution by processor 402.

The invention can take the form of an entirely hardware embodiment, or an embodiment containing both hardware and software elements.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk —read only memory (CD-ROM), compact disk —read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. In association with an electronic chip having a plurality of voltage domains, apparatus for monitoring levels of voltages of respective voltage domains, said apparatus comprising:

a single conductive link coupled to said chip;

a domain voltage selection network having a single output and a plurality of switchable inputs, said output being connected to said single conductive link, and two of said inputs being connected to monitor respective voltage levels of two of said plurality of voltage domains, wherein said single conductive link comprises only one pair of conductive c4 pins and wherein said single conductive link extends out from said chip to monitor a voltage level of each voltage domain from said plurality of voltage domains;

a control mechanism disposed to operate said network to selectively connect one of said inputs to said single conductive link, wherein the control mechanism is adapted to operate voltage and ground multiplexers in said network to simultaneously couple said voltage level and a ground connection of the same domain to said single conductive link and said control signals are applied to said multiplexers in a pre-specified sequence; and a sensor device external to said electronic chip connected to measure said monitored respective voltage levels of two of said plurality of voltage domains using said single conductive link, wherein a voltage applied to said single conductive link is routed through a differential transmission line configured to suppress voltage noise, before the voltage is measured.

2. In association with an electronic chip having a plurality of voltage domains, a method for monitoring levels of voltages of respective voltage domains, said method comprising the steps of:

configuring a domain voltage selection network within said chip, said selection network having a single output and multiple inputs, said output being connected to a single conductive link coupled to said chip, and two of said inputs being connected to monitor respective voltage levels of two of said plurality of voltage domains, wherein said single conductive link comprises only one pair of conductive c4 pins and wherein said single conductive link extends out from said chip to monitor a voltage level of each voltage domain from said plurality of voltage domains;

applying a set of control signals to said selection network, to operate said network to selectively connect one of said inputs to said single conductive link, wherein each of said control signals is adapted to operate voltage and ground multiplexers in said network to simultaneously couple said voltage level and a ground connection of the same domain to said single conductive link and said control signals are applied to said multiplexers in a pre-specified sequence; and measuring said monitored respective voltage levels of two of said plurality of voltage domains using said single conductive link, wherein a voltage applied to said single conductive link is routed through a differential transmission line configured to suppress voltage noise, before the voltage is measured.

3. In association with an electronic chip having a plurality of voltage domains, a recordable-type computer program product in a computer readable medium for monitoring levels of voltages of respective voltage domains, said computer program product comprising:

computer useable program code for configuring a domain voltage selection network within said chip, said selection network having a single output and multiple inputs, said output being connected to a single conductive link coupled to said chip, and two of said inputs being connected to monitor respective voltage levels of two of said plurality of voltage domains, wherein said single conductive link comprises only one pair of conductive c4 pins and wherein said single conductive link extends out from said chip to monitor a voltage level of each voltage domain from said plurality of voltage domains;

computer useable program code for applying a set of control signals to said selection network, to operate said network to selectively connect one of said inputs to said single conductive link, wherein each of said control signals is adapted to operate voltage and ground multiplexers in said network to simultaneously couple said voltage level and a ground connection of the same domain to said single conductive link and said control signals are applied to said multiplexers in a pre-specified sequence; and computer useable program code for measuring said monitored respective voltage levels of two of said plurality of voltage domains using said single conductive link, wherein a voltage applied to said single conductive link is routed through a differential transmission line configured to suppress voltage noise, before the voltage is measured. An apparatus and method are provided for monitoring the voltage available in each domain of multiple voltage domains of a partitioned electronic chip. The apparatus comprises a single conductive link coupled to the chip, and further comprises a domain selection network having a single output and a plurality of switchable inputs, the output being connected to the single conductive link, and two inputs being connected to monitor respective voltage levels of two of the plurality of voltage domains. A control mechanism is disposed to operate the selection network, in order to selectively connect one of the inputs to the single conductive link, and a sensor device external to the electronic chip is connected to measure the monitored respective voltage levels of two of the plurality of voltage domains using the single conductive link.

* * * * *